United States Patent
Asher et al.

(10) Patent No.: US 9,564,918 B2
(45) Date of Patent: Feb. 7, 2017

(54) REAL-TIME REDUCTION OF CPU OVERHEAD FOR DATA COMPRESSION

(71) Applicant: INTERNATIONAL BUSINESS MACHINES CORPORATION, Armonk, NY (US)

(72) Inventors: Ron Asher, Tel Aviv (IL); Danny Harnik, Tel Mond (IL); Oded Margalit, Ramat Gan (IL); Kat I. Ronen, Kfar-Saba (IL); Dmitry Sotnikov, Givataim (IL)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 85 days.

(21) Appl. No.: 13/738,300

(22) Filed: Jan. 10, 2013

(65) Prior Publication Data
US 2014/0195498 A1    Jul. 10, 2014

(51) Int. Cl.
G06F 17/00 (2006.01)
H03M 7/40 (2006.01)
H03M 7/30 (2006.01)

(52) U.S. Cl.
CPC .......... H03M 7/4037 (2013.01); H03M 7/607 (2013.01); H03M 7/6088 (2013.01)

(58) Field of Classification Search
CPC ...... H03M 7/30; H03M 7/4037; H03M 7/607; H03M 7/6088
USPC .......................................................... 707/693
See application file for complete search history.

(56) References Cited

U.S. PATENT DOCUMENTS

| | | | | |
|---|---|---|---|---|
| 5,486,826 A | * | 1/1996 | Remillard | H03M 7/30 341/51 |
| 5,532,692 A | * | 7/1996 | Tatsuya | 340/10.1 |
| 5,546,477 A | * | 8/1996 | Knowles et al. | 382/242 |
| 5,675,789 A | * | 10/1997 | Ishii | G06F 3/0601 |
| 5,701,463 A | | 12/1997 | Malcolm | |
| 5,768,445 A | | 6/1998 | Troeller et al. | |
| 6,049,797 A | | 4/2000 | Guha et al. | |

(Continued)

FOREIGN PATENT DOCUMENTS

| | | |
|---|---|---|
| CN | 1777038 A | 5/2006 |
| CN | 1949670 A | 4/2007 |

(Continued)

OTHER PUBLICATIONS

Mahalanobis, Abhijit, "Transform Domain Adaptive Compressive Sensing of Specific Objects", Visual Information Processing XX, Orlando, FL, Apr. 25, 2011, 9 pages.*

(Continued)

Primary Examiner — Robert Stevens
(74) Attorney, Agent, or Firm — Griffiths & Seaton PLLC

(57) ABSTRACT

Real-time reduction of CPU overhead for data compression is performed by a processor device in a computing environment. Non-compressing heuristics are applied on a randomly selected data sample from data sequences for determining whether to compress the data sequences. A compression potential is calculated based on the non-compressing heuristics. The compression potential is compared to a threshold value. The data sequences are either compressed if the compress threshold is matched, compressed using Huffman coding if Huffman coding threshold is matched, or stored without compression.

21 Claims, 11 Drawing Sheets

(56) References Cited

U.S. PATENT DOCUMENTS

| | | | |
|---|---|---|---|
| 6,055,339 A * | 4/2000 | Wilkinson | 382/251 |
| 6,195,024 B1 * | 2/2001 | Fallon | G06T 9/00 341/51 |
| 6,253,264 B1 | 6/2001 | Sebastian | |
| 6,309,424 B1 * | 10/2001 | Fallon | G06T 9/00 341/51 |
| 6,339,616 B1 * | 1/2002 | Kovalev | H04N 19/51 348/699 |
| 6,624,761 B2 * | 9/2003 | Fallon | G06T 9/00 341/51 |
| 6,731,814 B2 | 5/2004 | Zeck et al. | |
| 6,947,483 B2 * | 9/2005 | Engwer | H04B 1/66 358/1.16 |
| 7,161,506 B2 * | 1/2007 | Fallon | G06T 9/00 341/51 |
| 7,281,004 B2 * | 10/2007 | Lightstone | G06F 17/3046 |
| 7,378,992 B2 * | 5/2008 | Fallon | G06T 9/00 341/51 |
| 7,551,787 B2 * | 6/2009 | Marks | G06T 9/00 382/239 |
| 7,719,443 B1 * | 5/2010 | Natanzon | G06F 11/1471 341/50 |
| 7,773,731 B2 * | 8/2010 | Malik | H04M 3/493 379/88.05 |
| 7,774,456 B1 | 8/2010 | Lownsbrough et al. | |
| 7,930,436 B1 * | 4/2011 | Znosko | 709/247 |
| 8,295,615 B2 * | 10/2012 | Celi, Jr. | H04L 67/1095 382/232 |
| 8,306,956 B2 * | 11/2012 | Livshits | 707/693 |
| 8,676,725 B1 | 3/2014 | Lin et al. | |
| 8,712,978 B1 * | 4/2014 | Shilane et al. | 707/693 |
| 8,738,838 B2 * | 5/2014 | Cho et al. | 711/102 |
| 2001/0038347 A1 * | 11/2001 | Avery et al. | 341/51 |
| 2001/0054131 A1 | 12/2001 | Alvarez, II et al. | |
| 2002/0028021 A1 | 3/2002 | Foote et al. | |
| 2002/0198863 A1 | 12/2002 | Anjur et al. | |
| 2003/0030575 A1 | 2/2003 | Frachtenberg et al. | |
| 2004/0001160 A1 | 1/2004 | Herley | |
| 2004/0228533 A1 * | 11/2004 | Adelmann | 382/232 |
| 2005/0135690 A1 * | 6/2005 | Golla et al. | 382/245 |
| 2005/0192978 A1 * | 9/2005 | Lightstone | G06F 17/3046 |
| 2006/0106867 A1 | 5/2006 | Burges et al. | |
| 2006/0232593 A1 | 10/2006 | Lai et al. | |
| 2008/0279462 A1 * | 11/2008 | Celi, Jr. | H04L 67/1095 382/232 |
| 2009/0052784 A1 | 2/2009 | Covell et al. | |
| 2009/0070357 A1 | 3/2009 | Oh et al. | |
| 2010/0030797 A1 * | 2/2010 | Johnson | G06F 3/0608 707/693 |
| 2010/0070543 A1 | 3/2010 | Backa | |
| 2010/0161650 A1 | 6/2010 | Chaitanya et al. | |
| 2010/0189351 A1 * | 7/2010 | Mattausch | H03M 7/40 382/173 |
| 2010/0325094 A1 | 12/2010 | Yang et al. | |
| 2011/0252183 A1 * | 10/2011 | Cho et al. | 711/102 |
| 2011/0285559 A1 * | 11/2011 | Fallon | G06T 9/00 341/87 |
| 2012/0001777 A1 | 1/2012 | Litvak | |
| 2012/0124105 A1 | 5/2012 | Provenzano | |
| 2012/0207216 A1 | 8/2012 | Yu et al. | |
| 2012/0278884 A1 | 11/2012 | Menoher | |
| 2013/0179659 A1 * | 7/2013 | Seo et al. | 711/170 |
| 2013/0254441 A1 * | 9/2013 | Kipnis et al. | 710/68 |
| 2013/0275396 A1 * | 10/2013 | Condict et al. | 707/693 |
| 2014/0195497 A1 | 7/2014 | Amit et al. | |
| 2014/0195499 A1 | 7/2014 | Amit et al. | |
| 2014/0195500 A1 | 7/2014 | Amit et al. | |
| 2015/0234852 A1 | 8/2015 | Amit et al. | |
| 2015/0317381 A1 | 11/2015 | Amit et al. | |

FOREIGN PATENT DOCUMENTS

| | | |
|---|---|---|
| CN | 101068358 A | 11/2007 |
| WO | 2014108818 A1 | 7/2014 |

OTHER PUBLICATIONS

Papaefstathiou, Ioannis, "Accelerating ATM: On-line Compression of ATM Streams", PCCC 1999, Scottsdale, AZ, Feb. 12, 1999, pp. 233-239.*

Mahalanobis, Abhijit, et al., "Object Specific Image Reconstruction using a Compressive Sensing Architecture for Application in Surveillance Systems", IEEE Transactions on Aerospace and Electronic Systems, vol. 45, No. 3, Jul. 2009, pp. 1167-1180.*

Lee, Hyung Gyu, et al., "A Compression-based Hybrid MLC/SLC Management Technique for Phase-Change Memory Systems", ISVLSI 2012, Amherst, MA Aug. 19-21, 2012, pp. 386-391.*

Lee, Jang-Soo, et al., "Design and Evaluation of a Selective Compressed Memory System", ICCD 1999, Austin, TX, Oct. 10-13, 1999, pp. 184-191.*

Goh, Chien-Le, et al., "Chapter 13: Database Compression with Data Mining Methods", Information Organization and Databases, Springer Science+Business Media, New York, NY, © 2000, pp. 177-190.*

INSPEC: Real-Time Network Streaming of Dynamic 3D Content with In-frame and Inter-frame Compression AN-12316686; Gasparello, PS. et al.; 2011, 1 page.

ip.com: Efficient Monitoring of Plan Execution CPU Costs in a Database Server IBM; Sep. 25, 2009, 10 pages.

ip.com: Methods for measuring the CPU overhead of a transaction oriented monitoring tool IBM; Jan. 19, 2006, 12 pages.

Coyne, L. et al.; "IBM System Storage N series Data Compression and De-duplication Data ONTAP 8.1 Operating in 7-Mode"; IBM Corporation, www.ibm.com/redbooks/sg248033; Jul. 2012, 110 pages.

Moerti, DF. et al.; "Direct Access Storage Device Compression and Decompression Data Flow"; http://www.ip.com/pubview/IPCOM000116855D; Mar. 31, 2005, 7 pages.

Ruei-Sung Lin et al., SPEC Hashing: Similarity Preserving Algorithm for Entropy-based Coding, Jun. 13, 2010, pp. 848-854, 2010 IEEE Conference.

Nobuyoshi Sato et al., Target Selection by Similarity Preserve Hash in Distributed System for Geographical Origin Identification of Vegetables, Apr. 18, 2006, 6 pages, IEEE.

Diner, "Competitive Parallel Processing for Compression of Data," NTIS Tech Notes 2301, May 1, 1990 (2 pages).

* cited by examiner

REAL-TIME REDUCTION OF CPU OVERHEAD FOR DATA COMPRESSION

BACKGROUND OF THE INVENTION

1. Field of the Invention

The present invention relates in general to computers, and more particularly to real-time reduction of CPU overhead for data compression in a computing environment.

2. Description of the Related Art

In today's society, computer systems are commonplace. Computer systems may be found in the workplace, at home, or at school. Computer systems may include data storage systems, or disk storage systems, to process and store data. Data storage systems, or disk storage systems, are utilized to process and store data. A storage system may include one or more disk drives. These data processing systems typically require a large amount of data storage. Customer data, or data generated by users within the data processing system, occupies a great portion of this data storage. Many of these computer systems include virtual storage components.

Data compression is widely used to reduce the amount of data required to process, transmit, or store a given quantity of information. Data compression is the coding of data to minimize its representation. Compression can be used, for example, to reduce the storage requirements for files, to increase the communication rate over a channel, or to reduce redundancy prior to encryption for greater security. However, data compression consumes a significant amount of computing (e.g. central processing unit "CPU") resources.

SUMMARY OF THE DESCRIBED EMBODIMENTS

In one embodiment, a method is provided for real-time reduction of CPU overhead for data compression using a processor device. Non-compressing heuristics are applied on a randomly selected data sample from data sequences for determining whether to compress the data sequences. A compression potential is calculated based on the non-compressing heuristics. The compression potential is compared to a threshold value. The data sequences are either compressed if the compress threshold is matched, compressed using Huffman coding if Huffman coding threshold is matched, or stored without compression.

In another embodiment, a computer system is provided for real-time reduction of CPU overhead for data compression. The computer system includes a computer-readable medium and a processor in operable communication with the computer-readable medium. The processor applies non-compressing heuristics on a randomly selected data sample from data sequences for determining whether to compress the data sequences. A compression potential is calculated based on the non-compressing heuristics. The compression potential is compared to a threshold value. The data sequences are either compressed if the compress threshold is matched, compressed using Huffman coding if Huffman coding threshold is matched, or stored without compression.

In a further embodiment, a computer program product is provided for real-time reduction of CPU overhead for data compression. The computer-readable storage medium has computer-readable program code portions stored thereon. The computer-readable program code portions include a first executable portion that applies non-compressing heuristics on a randomly selected data sample from data sequences for determining whether to compress the data sequences. A compression potential is calculated based on the non-compressing heuristics. The compression potential is compared to a threshold value. The data sequences are either compressed if the compress threshold is matched, compressed using Huffman coding if Huffman coding threshold is matched, or stored without compression.

In addition to the foregoing exemplary method embodiment, other exemplary system and computer product embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which.

DETAILED DESCRIPTION OF THE DRAWINGS

Figure 1:
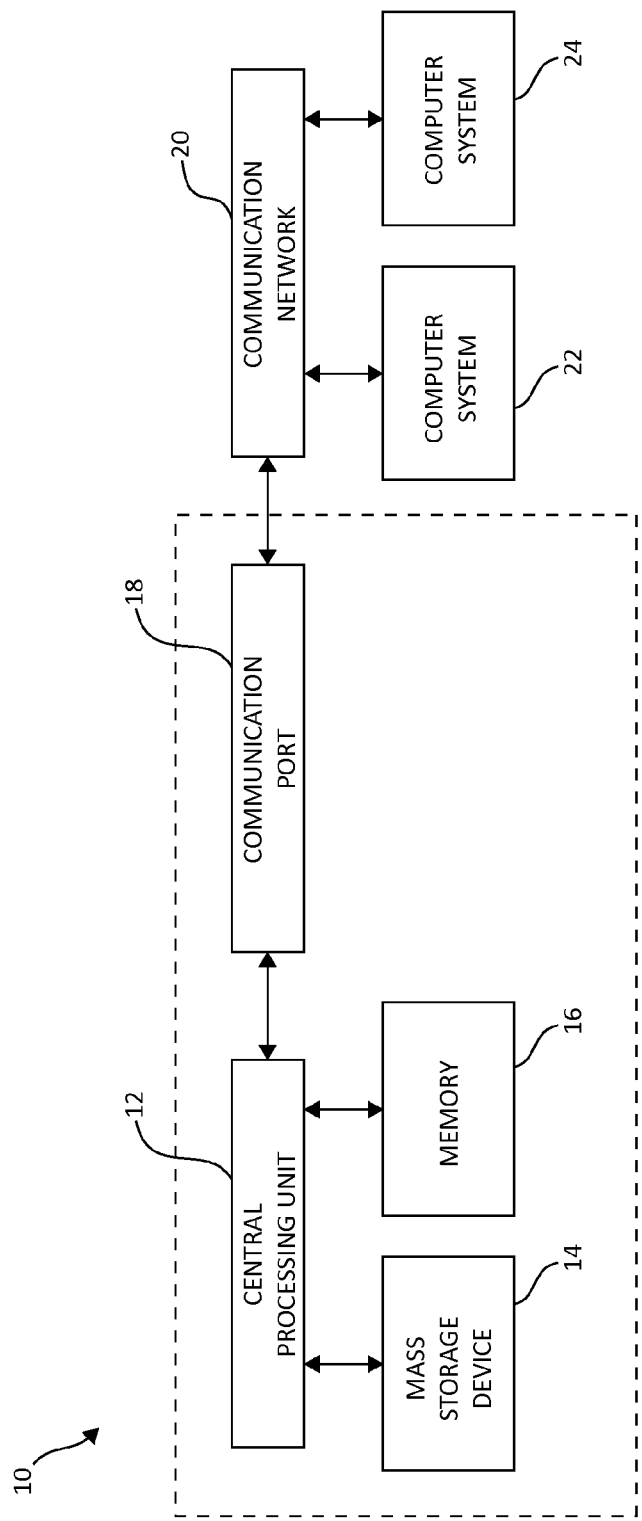
FIG. 1 is a block diagram illustrating a computer storage environment having an exemplary storage device in which aspects of the present invention may be realized.

As previously mentioned, data compression consumes a significant amount of computing (e.g., central processing unit "CPU") resources. The time required for compression depends upon a compression ratio. A compression ratio is calculated by dividing the length of the output of the compression by the length of the input data. For example, the compression ratio may be a number between zero and one. In the case that the output of the compression is larger than the input data, the compression ratio is larger than one. A small compression ratio indicates a high benefit from compression, and a larger compression ratio number indicates a low benefit from compression. Uncompressible data costs more to process than highly compressible data. The difference may be up to four times in cost. For each input data (e.g., data stream/sequence) there is an equivalent compressed output data buffer. The size of the output-compressed buffer depends on the content of the input buffer and the compression method used. Some input data cannot be compressed to a significantly smaller output buffer, or the amount of CPU resources that are needed to achieve a meaningful compressed output is too high. Unfortunately, this can be detected only after the input data was processed and compressed. Thus, an accurate decision for determining whether to compress or not compress a data stream cannot be made before performing the actual compression. In short, determining whether to compress data has both advantages and disadvantages. For example, one advantage for compressing data is that storage capacity is saved by compressing the volume (e.g., reduce disk drives, storage footprint, cooling, and power, etc.). However, one disadvantage is compressing all data may waste system resources and time by compressing a substantial amount of uncompressible data that is stored in a volume.

In contrast, and to address this need, the present invention provides a solution for detecting data that cannot be compressed, or for which compression will only gain a very small reduction thereby skipping the compression of this data. Moreover, the present invention allows for another possible decision of compressing the data stream but only using a lighter compression technique, e.g., use only Huffman coding. The detection method reads randomly selected small fragments of the input data (e.g., data streams) and computes a set of heuristics on the data. The decision to compress, not to compress, or to compress using only Huffman coding is determined by the output of the heuristics. In the context of a real-time compression, the CPU resources available to perform compression are limited. Thus, identifying input data (e.g., data streams) that is not compressible, or compressed to a small degree, allows the system (e.g., CPU) resources to be used for compressing data that can be significantly compressed. Current methods that predict a compression ratio first require actual compression of data, or significant portion of the data. In one embodiment, an estimation by compressing the prefix of the input data is applied. The prefix size must be long enough to provide good enough accuracy.

In one embodiment, by way of example only, the present invention performs the determination as to whether to compress and/or not compress the data and execute this process before compressing the data, and to compress (or how/not to compress) based on an indication provided. In this way, the determination as to whether a meaningful compression ratio can be achieved, or that the input should not be compressed, allows for saving of CPU resources and reduces "wasted" resources. In one embodiment, the present invention incurs very little system/CPU resource overhead as compared to the CPU resource overhead for actual compression. Also, the present invention allows focusing the resources only when meaningful compression is achieved.

As will be described below, in one embodiment, the present invention provides a solution for real-time reduction of CPU overhead for data compression using a processor device. Non-compressing heuristics are applied on a randomly selected data sample from data sequences for determining whether to compress the data sequences. Compression potential is calculated based on the non-compressing heuristics, which are heuristics that do not perform compression on the data. The compression potential is compared to a threshold value. The data sequences are either compressed, encoded using Huffman coding, or stored if the compression potential matches a threshold value.

Turning now to FIG. 1, exemplary architecture 10 of data storage systems (e.g., virtual tape systems) in a computing environment is depicted. The computer system 10 includes central processing unit (CPU) 12, which is connected to mass storage device(s) 14 and memory device 16. Mass storage devices can include hard disk drive (HDD) devices, solid-state devices (SSD) etc., which can be configured in a redundant array of independent disks (RAID). The backup operations further described can be executed on device(s) 14, located in system 10 or elsewhere. Memory device 16 can include such memory as electrically erasable programmable read only memory (EEPROM) or a host of related devices. Memory device 16 and mass storage device 14 are connected to CPU 12 via a signal-bearing medium. In addition, CPU 12 is connected through communication port 18 to a communication network 20, having an attached plurality of additional computer systems 22 and 24.

Figure 2:
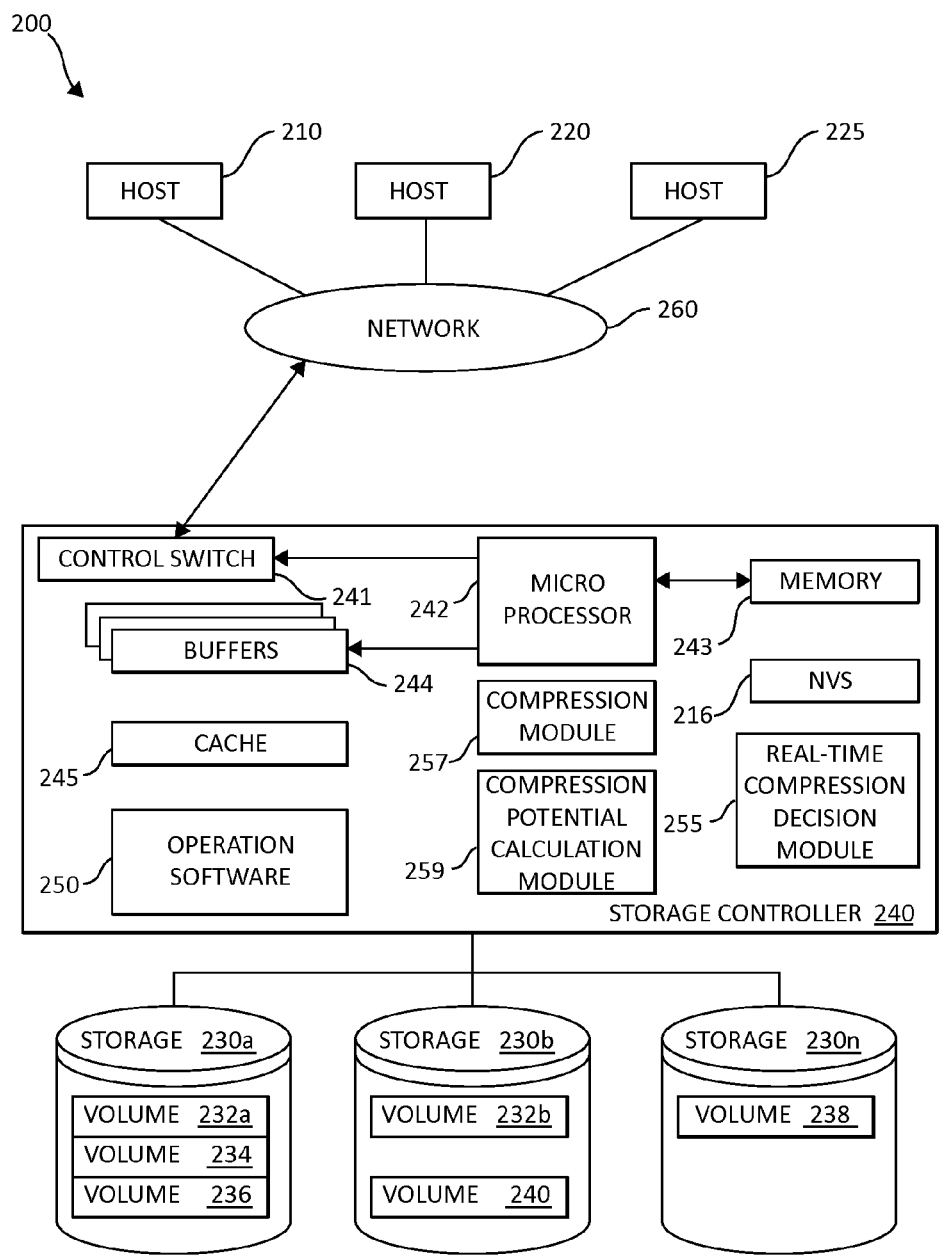
FIG. 2 is a block diagram illustrating a hardware structure of an exemplary data storage system in a computer system in which aspects of the present invention may be realized.

FIG. 2 is an exemplary block diagram 200 showing a hardware structure of a data storage system in a computer system according to the present invention. Referring to FIG. 2, there are shown host computers 210, 220, 225, each acting as a central processing unit for performing data processing a part of a data storage system 200. The hosts (physical or virtual devices), 210, 220, and 225 may be one or more new physical devices or logical devices to accomplish the purposes of the present invention in the data storage system 200. In one embodiment, by way of example only, a data storage system 200 may be implemented as IBM® System Storage™ DS8000™. A network connection 260 may be a fibre channel fabric, a fibre channel point to point link, a fibre channel over ethernet fabric or point to point link, a FICON or ESCON I/O interface, any other I/O interface type, a wireless network, a wired network, a LAN, a WAN, heterogeneous, homogeneous, public (i.e. the Internet), private, or any combination thereof. The hosts, 210, 220, and 225 may be local or distributed among one or more locations and may be equipped with any type of fabric (or fabric channel) (not shown in FIG. 2) or network adapter 260 to the storage controller 240, such as Fibre channel, FICON, ESCON, Ethernet, fiber optic, wireless, or coaxial adapters. Data storage system 200 is accordingly equipped with a suitable fabric (not shown in FIG. 2) or network adapter 260 to communicate. Data storage system 200 is depicted in FIG. 1 comprising storage controller 240 and storage 230.

To facilitate a clearer understanding of the methods described herein, storage controller 240 is shown in FIG. 2 as a single processing unit, including a microprocessor 242, system memory 243 and nonvolatile storage ("NVS") 216, which will be described in more detail below. It is noted that in some embodiments, storage controller 240 is comprised of multiple processing units, each with their own processor complex and system memory, and interconnected by a dedicated network within data storage system 200. Storage 230 may be comprised of one or more storage devices, such as storage arrays, which are connected to storage controller 240 by a storage network.

In some embodiments, the devices included in storage 230 may be connected in a loop architecture. Storage controller 240 manages storage 230 and facilitates the processing of write and read requests intended for storage 230. The system memory 243 of storage controller 240 stores program instructions and data, which the processor 242 may access for executing functions and method steps associated with managing storage 230 and executing the steps and methods of the present invention in a computer storage environment. In one embodiment, system memory 243 includes, is associated, or is in communication with the operation software 250 in a computer storage environment, including the methods and operations described herein. As shown in FIG. 2, system memory 243 may also include or be in communication with a cache 245 for storage 230, also referred to herein as a "cache memory", for buffering "write data" and "read data", which respectively refer to write/read requests and their associated data. In one embodiment, cache 245 is allocated in a device external to system memory 243, yet remains accessible by microprocessor 242 and may serve to provide additional security against data loss, in addition to carrying out the operations as described in herein.

In some embodiments, cache 245 is implemented with a volatile memory and non-volatile memory and coupled to microprocessor 242 via a local bus (not shown in FIG. 2) for enhanced performance of data storage system 200. The NVS 216 included in data storage controller is accessible by microprocessor 242 and serves to provide additional support for operations and execution of the present invention as described in other figures. The NVS 216, may also referred to as a "persistent" cache, or "cache memory" and is implemented with nonvolatile memory that may or may not utilize external power to retain data stored therein. The NVS may be stored in and with the Cache 245 for any purposes suited to accomplish the objectives of the present invention. In some embodiments, a backup power source (not shown in FIG. 2), such a battery, supplies NVS 216 with sufficient power to retain the data stored therein in case of power loss to data storage system 200. In certain embodiments, the capacity of NVS 216 is less than or equal to the total capacity of cache 245.

Storage 230 may be physically comprised of one or more storage devices, such as storage arrays. A storage array is a logical grouping of individual storage devices, such as a hard disk. In certain embodiments, storage 230 is comprised of a JBOD (Just a Bunch of Disks) array or a RAID (Redundant Array of Independent Disks) array. A collection of physical storage arrays may be further combined to form a rank, which dissociates the physical storage from the logical configuration. The storage space in a rank may be allocated into logical volumes, which define the storage location specified in a write/read request.

In one embodiment, by way of example only, the storage system as shown in FIG. 2 may include a logical volume, or simply "volume," may have different kinds of allocations. Storage 230a, 230b and 230n are shown as ranks in data storage system 200, and are referred to herein as rank 230a, 230b and 230n. Ranks may be local to data storage system 200, or may be located at a physically remote location. In other words, a local storage controller may connect with a remote storage controller and manage storage at the remote location. Rank 230a is shown configured with two entire volumes, 234 and 236, as well as one partial volume 232a. Rank 230b is shown with another partial volume 232b. Thus volume 232 is allocated across ranks 230a and 230b. Rank 230n is shown as being fully allocated to volume 238—that is, rank 230n refers to the entire physical storage for volume 238. From the above examples, it will be appreciated that a rank may be configured to include one or more partial and/or entire volumes. Volumes and ranks may further be divided into so-called "tracks," which represent a fixed block of storage. A track is therefore associated with a given volume and may be given a given rank.

The storage controller 240 may include a real-time compression decision module 255, a compression module 257, a heuristic module 258, and a compression potential calculation module 259 in a computer storage environment. The real-time compression decision module 255, the compression module 257, the heuristic module 258, and the compression potential calculation module 259 may work in conjunction with each and every component of the storage controller 240, the hosts 210, 220, 225, and storage devices 230. The real-time compression decision module 255, the compression module 257, the heuristic module 258, and the compression potential calculation module 259 may be structurally one complete module working together and in conjunction with each other for performing such functionality as described below, or may be individual modules. The real-time compression decision module 255, the compression module 257, the heuristic module 258, and the compression potential calculation module 259 may also be located in the cache 245 or other components of the storage controller 240 to accomplish the purposes of the present invention.

The storage controller 240 may be constructed with a control switch 241 for controlling the fiber channel protocol to the host computers 210, 220, 225, a microprocessor 242 for controlling all the storage controller 240, a nonvolatile control memory 243 for storing a microprogram (operation software) 250 for controlling the operation of storage controller 240, data for control and each table described later, cache 245 for temporarily storing (buffering) data, and buffers 244 for assisting the cache 245 to read and write data, a control switch 241 for controlling a protocol to control data transfer to or from the storage devices 230, real-time compression decision module 255, the compression module 257, the heuristic module 258, and the compression potential calculation module 259 on which information may be set. Multiple buffers 244 may be implemented with the present invention in a computing environment, or performing other functionality in accordance with the mechanisms of the illustrated embodiments.

In one embodiment, by way of example only, the host computers or one or more physical or virtual devices, 210, 220, 225 and the storage controller 240 are connected through a network adaptor (this could be a fiber channel) 260 as an interface i.e., via a switch sometimes referred to as "fabric." In one embodiment, by way of example only, the operation of the system shown in FIG. 2 will be described. The microprocessor 242 may control the memory 243 to store command information from the host device (physical or virtual) 210 and information for identifying the host device (physical or virtual) 210. The control switch 241, the buffers 244, the cache 245, the operating software 250, the microprocessor 242, memory 243, NVS 216, real-time compression decision module 255, the compression module 257, the heuristic module 258, and the compression potential calculation module 259 are in communication with each other and may be separate or one individual component(s). Also, several, if not all of the components, such as the operation software 245 may be included with the memory 243 in a computer storage environment. Each of the components within the storage device may be linked together and may be in communication with each other for purposes suited to the present invention.

Based upon the embodiments described herein, the present invention applies the non-compressing heuristics regarding/to a relation between character pairs of core characters and random distributions of the character pairs of the core characters from randomly selected data sample from data sequences for determining whether to compress the data sequences by calculating a compression potential based on the non-compressing heuristics. The real-time compression decision tool allows for a decision to be made so as to determine whether to compress an input data stream (or data sequences) or not compress the input data stream. In other words, the decision operation allows for conserving resources rather than compressing a small part of data and then next deciding what to store on a disk. Without this decision operation, system resources are wasted by compressing a small part of data and then deciding what to store on a disk, particularly when consecutive data characteristics change, from compressible to non-compressible, and vice versa. When most consecutive data is mostly compressible, compressing a small prefix of the data is used as a mechanism to decide whether to compress the data. In such a case, the system can continue to compress from the end of the prefix to the end of the data, and the resources used here are not lost.

The decision operation is a real-time compression decision tool that may work inside an input/output (I/O) path and provides a decision on each write block if the write block should be compressed. The decision is determined by sampling data with low overhead and using a set of light-weight heuristics to determine compression potential (e.g., collecting simple heuristic parameters over the data chunk that tend to characterize the data chunk's compressibility and making the decision solely based on these heuristics). The heuristics may be extremely efficient and may be much more efficient than actually compressing the data chunk. The decision operation reduces overall resources used by real-time compression, for example, by skipping "uncompressible" data. Moreover, the present invention applies entropy to assist in the decision operation, with various compression properties.

Figure 3:
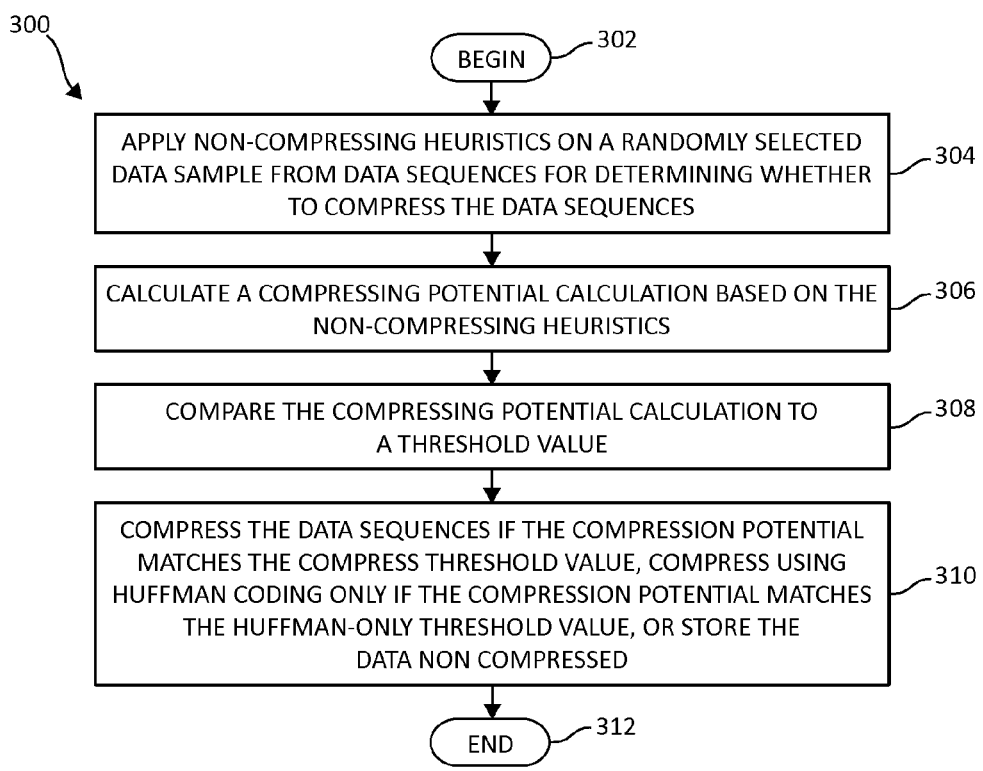
FIG. 3 is a flow chart diagram illustrating an exemplary method for real-time reduction of CPU overhead for data compression in which aspects of the present invention may be realized.

Turning now to FIG. 3, an exemplary method 300 for real-time reduction of CPU overhead for data compression is illustrated. The method 300 begins (step 302) by applying a non-compressing heuristics on a randomly selected data sample from data sequences for determining whether to compress the data sequences (step 304). In one embodiment an entire buffer may be selected. A compression potential is calculated based on the non-compressing heuristics (step 306). The compression potential is compared to a threshold value (step 308). The method 300 may either compress the data sequences if the compression potential matches the compress threshold value, compress using Huffman coding only if the compression potential matches the Huffman-only threshold value, otherwise, or store the data as non compressed (step 310). The method 300 ends (step 312).

To further explain FIGS. 1-3, in one embodiment, by way of example, the present invention 1) selects a small sample of the input data buffer; (2) computes a set of heuristics that can be quickly computed (compared to the compression time) and are able to indicate the compressibility of the input; (3) computes a compression potential function based on the heuristics; and (4) compresses the input only if the compression potential function indicate that the data matches a threshold. The input data buffer can be an application file or a data block. The sample of the data sequences can be the entire input buffer and/or randomly selected (or predefined) sequences of bytes from the buffer. The sample size may be further adapted to the number of distinct characters in the input buffer (also known as alphabet size) and can be a function of the alphabet size.

The heuristics used for determining whether to compress or how to compress can be from the following examples. 1) The Byte Entropy of the sampled data (e.g., entropy is an indication of the uncertainty associated with a random variable). In this context, this is known as the Shannon entropy, which describes the expected value of the information contained in the data). The byte entropy is example of such a natural indicator for data compressibility for the data. Byte entropy may be an accurate estimation of the benefits of an optimized Huffman encoding, and in general compression is generally more effective on buffers with lower entropy. 2) The core character set (coreset)—the set of characters that compose the majority (which is determined as a predefined percentage) of the bytes in the sample. The core set may be defined as the set of unique symbols that compose a majority (e.g., 90%) of the data. For example, the set of characters that compose 90% of the sample. In the described embodiment, the present invention uses the size of the corset as a threshold. 3) The relation between appearances of character pairs and a random (uniform) distribution of such pairs of characters (see below for a detailed example calculation). 4) Entropy of character pairs.

Figure 4:
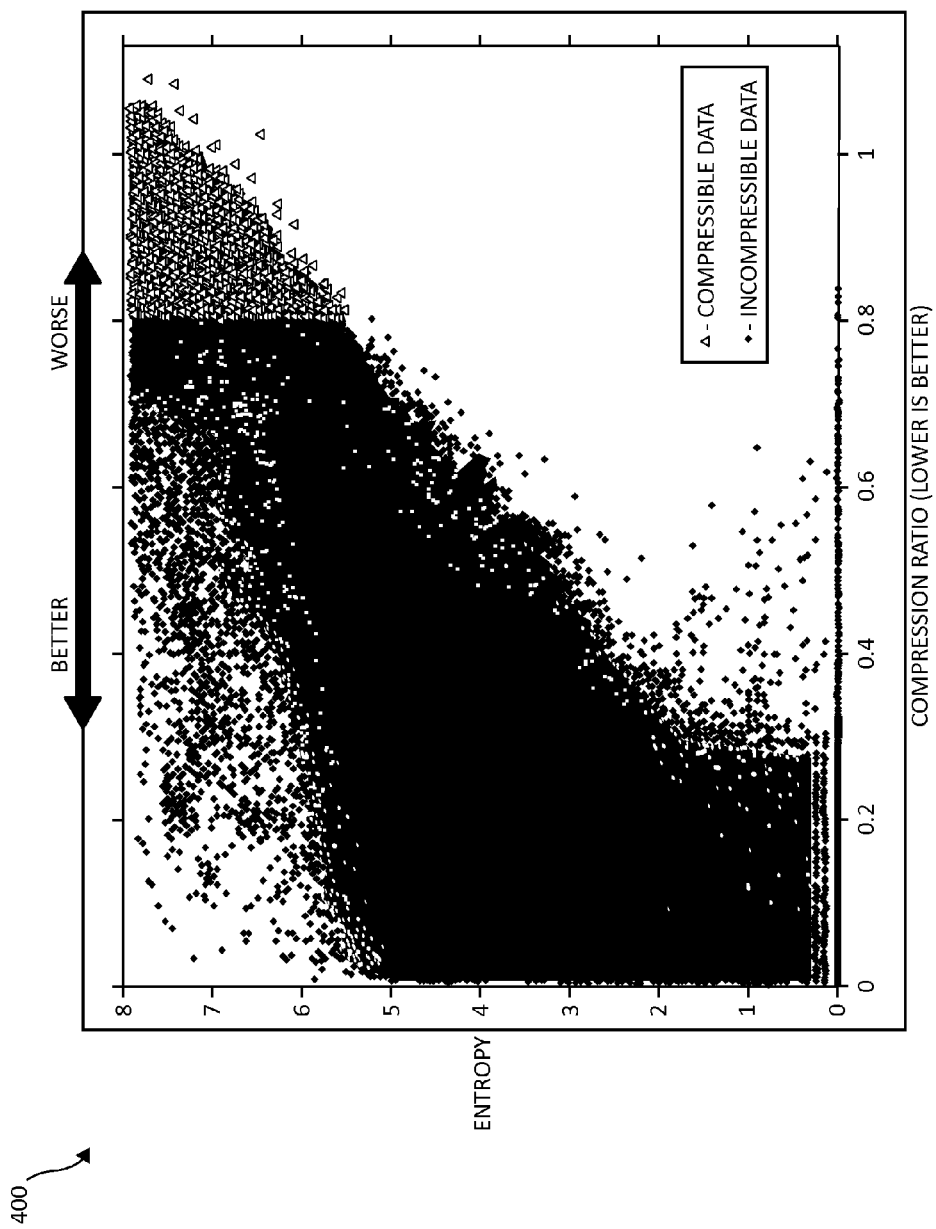
FIG. 4 is an exemplary graph diagram of byte entropy as a function of the compression ratio of the file server data set in which aspects of the present invention may be realized.

To illustrate entropy, FIG. 4 depicts the correlation for the file server data set, where entropy and compression ratio were computed for 8 KB data blocks. Turning now to FIG. 4, an exemplary graph diagram 400 of byte entropy as a function of the compression ratio of the file server data set in which aspects of the present invention may be realized, is illustrated. The X-axis illustrates a compression ratio ranging from 0 to 1.1. The entropy of the computing system is illustrated on the Y-Axis ranging from 0 to 8. These values for both the X-axis and Y-axis are used for illustration purposes. The compressible data and the incompressible data are shown in FIG. 4. As illustrated, for the file server data set, entropy of less than 5.5 typically predicts that the data will be compressible (compression ratio less than 0.8). As illustrated, there is compressible data whose entropy is higher than 5.5, which is mainly due to the fact that entropy does not measure repetitions in the data, and therefore cannot capture all aspects of compression. Thus, the illustrated embodiments described herein provide a more precise indication of compressibility.

In one embodiment, for the purpose of speed optimization of the computing system, the heuristics may be calculated one after the other (e.g., continuously calculating the heuristics), and make a decision (whether to compress or not) or compute the next heuristic based on a heuristic score that is calculated. The random sampling may be adaptive and continue until there is a statistically sound number of samples and is also adaptive to the encountered alphabet. Data structures and indexes may be used in conjuncture with the random samples thereby reducing memory footprint and scans. The calculations of the heuristics may occur one by one (light to heavy) to try and decide only what is need as compared to what a user really needs. Hence the speed is optimized by these approaches. For example, the decision overhead consumed for highly compressible data may be observed to be around 10% and less than 3% for uncompressible data.

The compression potential function may be computed based on portions and/or all the heuristics score. The relation between appearances of character pairs and a random (uniform) distribution of such pairs of characters can be estimated as follows (two example embodiments are provided). 1) A number of pairs from the coreset that are found in the sample may be compared against the number of pairs from the coreset that are expected if these pairs would appear in a pure, random manner/distribution in the random sampled text. 2) The $L_2^{norm}$ (Euclidian) distance between the following two vectors of distributions on pair values are computed: (a) a first vector of distributions that represents the observed distribution of pairs from the coreset in the sample, and (b) a second vector of distributions that represents the (statistical) expected pair distribution based on the single characters histogram, assuming there is no correlation between subsequent character pairs. 3) Another option is to measure the entropy of consecutive character pairs (over the coreset), and moreover, compare the relative entropy of the observed character pairs with the (statistical) expected character pair entropy based on the single characters histogram. The detection and decision function can be intermittently be turned on and off according to a predefined setting. For example, one of the following settings can be used: 1) Always apply—run the heuristics and give an indication if the data should be compressed. 2) Apply the heuristics on demand when the compression ratio is above a given threshold for a predefined number of buffers/bytes, and turned off when all (or most of) the data is compressible at a good ration. 3) Apply the heuristics according to the size of the buffer—only for a given set of buffer sizes. 4) Apply the heuristics together with prefix compression using a detection based on prefix compression when most of the data is compressible, and using the heuristics when the compressibility frequently changes.

Figure 5:
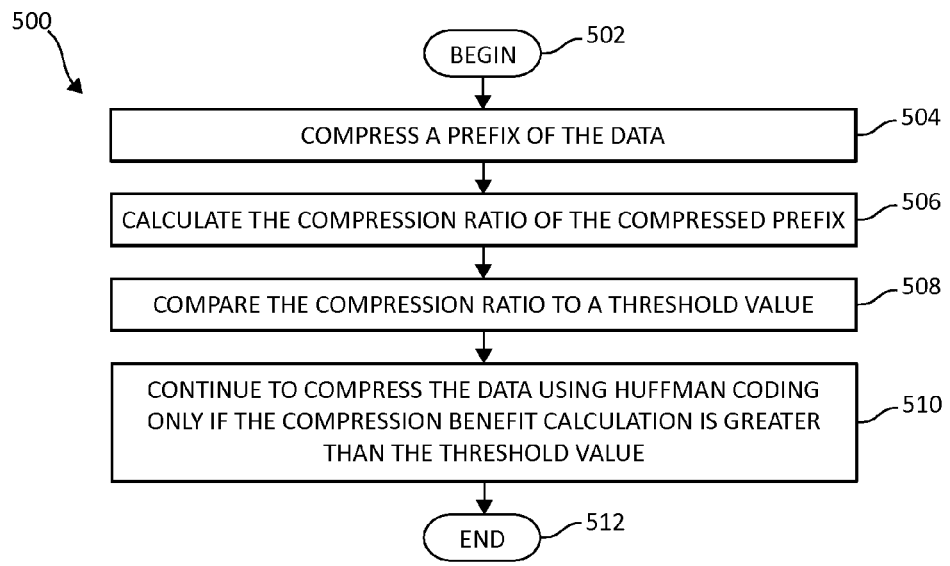
FIG. 5 is a flow chart diagram illustrating an exemplary method for real-time reduction of CPU overhead for data compression using prefix compression estimation which may be combined with the present invention.

FIG. 5 is a flow chart diagram illustrating an exemplary method 500 for real-time reduction of CPU overhead for data compression using prefix compression estimation, which may be combined with the present invention. The method 500 begins (step 502) by compressing a prefix of the data (step 504). A compression ratio (e.g., a prefix compression ratio) of the compressed prefix is calculated (step 506). The compression ratio is compared to a threshold value (step 508). The method 500 continues to compress the data using Huffman coding only if the compression benefit calculation is greater than the threshold value (step 510). The method ends (step 512).

Figure 6:
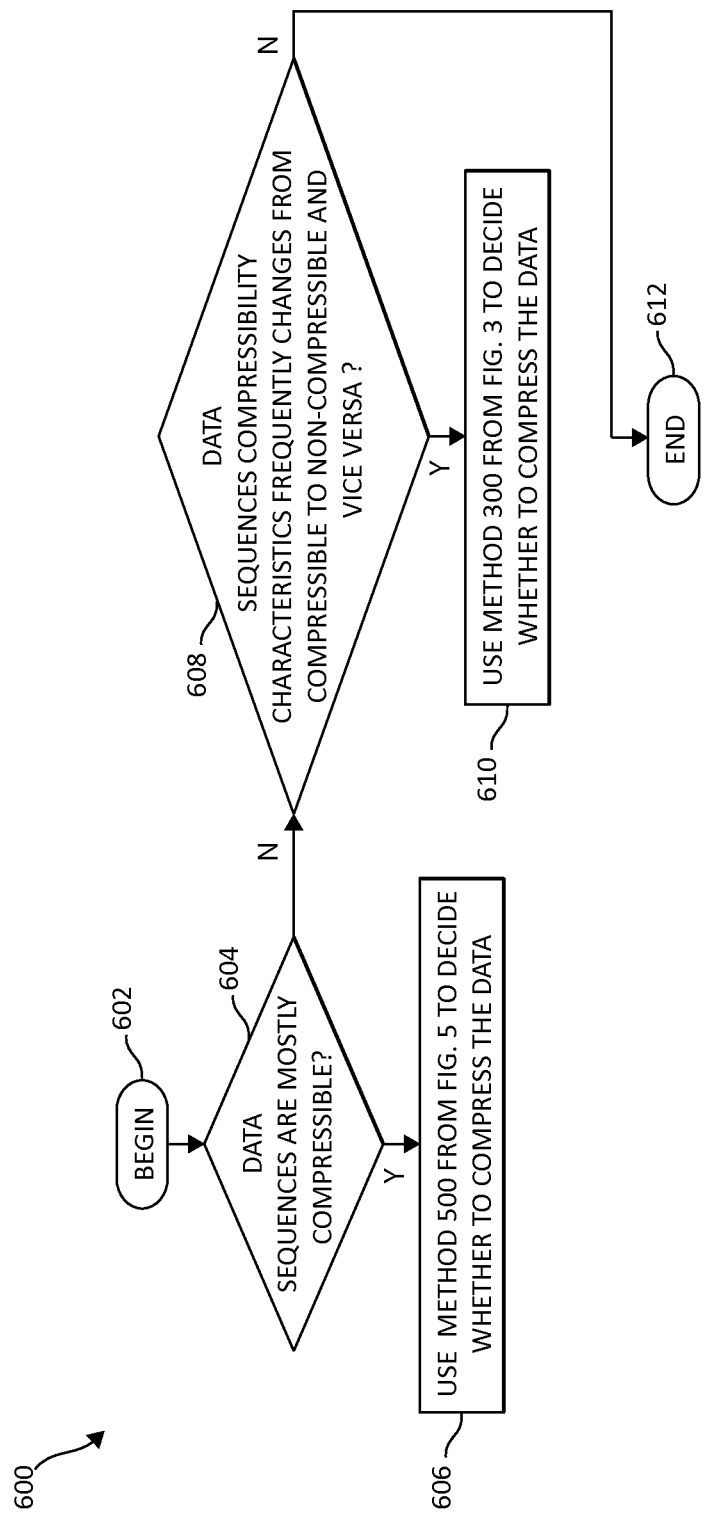
FIG. 6 is a flow chart diagram illustrating an exemplary method for real-time reduction of CPU overhead for data compression using both heuristics and prefix compression estimation in which aspects of the present invention may be realized.

FIG. 6 is a flow chart diagram illustrating an exemplary method 600 for real-time reduction of CPU overhead for data compression using both heuristics and prefix compression estimation in which aspects of the present invention may be realized. The method 600 begins (step 602) by determining if data sequences are mostly (e.g., greater than 50%) compressible (step 604). If yes, the method 600 uses method 500 as described in FIG. 5, above, to decide whether to compress the data (step 606). If no, the method 600 determines if data sequences compressibility characteristics frequently changes from compressible to non-compressible and vice versa (step 608). If yes, the method 600 uses the method 300, as described in FIG. 3 above, to decide whether to compress the data (step 610). If no, the method 600 ends (step 612).

Figure 7:
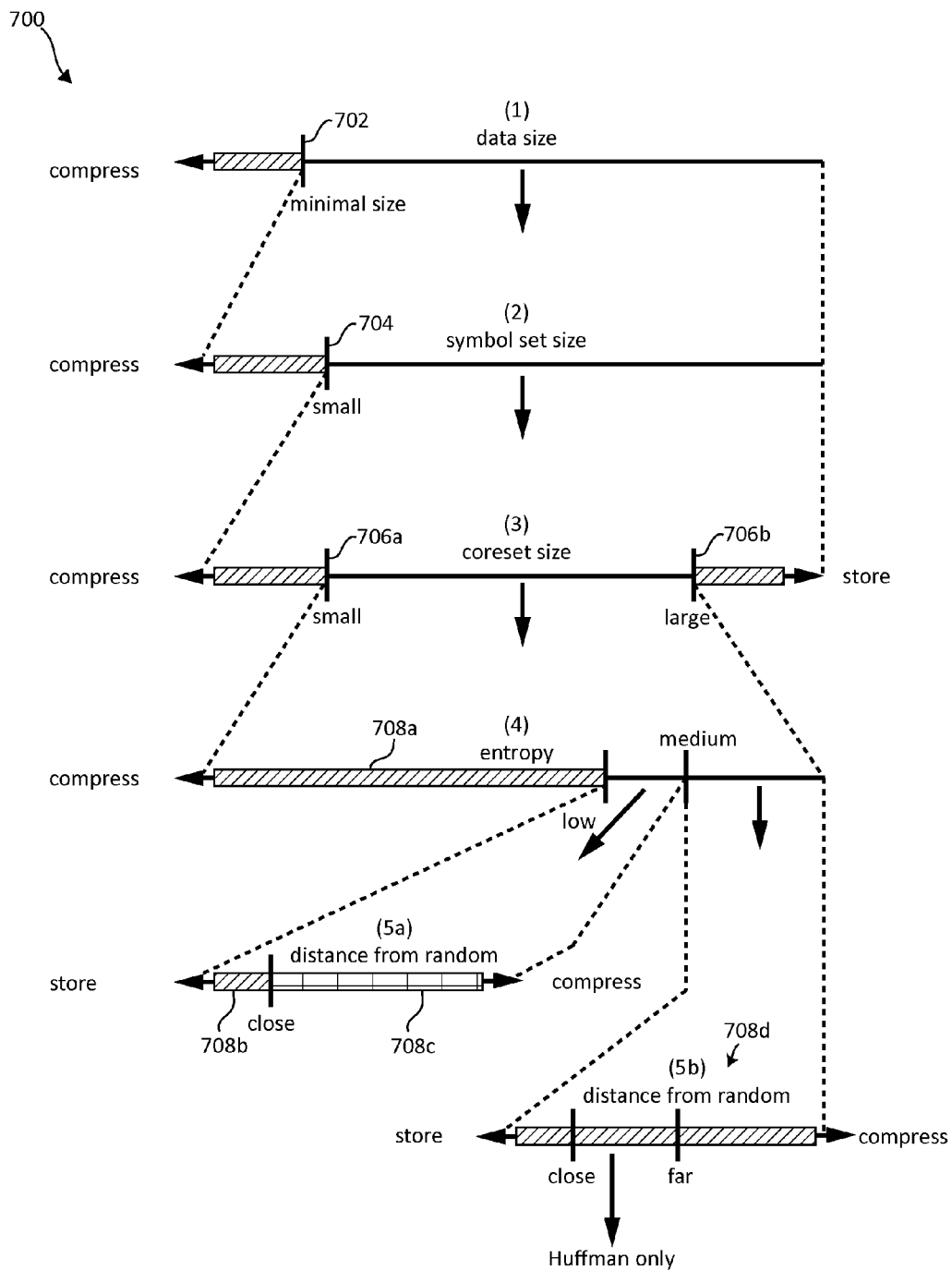
FIG. 7 is a detailed flow diagram for real-time reduction of CPU overhead for data compression using the heuristics in which aspects of the present invention may be realized.

FIG. 7 is a block flow diagram illustrating a method for real-time reduction of CPU overhead for data compression using the heuristics in which aspects of the present invention may be realized. FIG. 7 describes 1) the heuristics approach: a) a possible order of the heuristics, b) how thresholds are applied, c) how to a compress, and d) encode using Huffman coding or store the data. Thus, in one embodiment, the present invention is composed of (1) random sampling a small subset of the write operation data, and (2) providing a recommendation on whether to compress or not compress the data based on the heuristics, as described above. As illustrated in below in FIG. 7, the algorithm flow is from top to bottom, and at each step one parameter or heuristic is examined. A recommendation is made if the heuristic satisfies given thresholds. The horizontal arrows represent recommendations and the downward arrows represent moving to the next heuristic computation, except the bottom arrow on step (5), which is also a recommendation. The vertical bars represent the thresholds for making the recommendation at each step. The algorithm is designed to make a recommendation as early as possible, reducing the computation overhead. As illustrated in FIG. 7, in step 702 (e.g., number "1" in FIG. 7) small amounts of data (smaller than 1 KB) are always compressed, as calculating the heuristics will generally take longer than compressing. In step 704 (e.g., number "2" in FIG. 7), if the total number of distinct symbols in the data is very small (e.g., 50), then the data is compressed. In step 706a (e.g., number "3" in FIG. 7), if the coreset size is very small (e.g., smaller than 50), then the data is compressed, and in step 706b (e.g., number "3" in FIG. 7), if the coreset size is very large (e.g., larger than 200), the data is stored (e.g., the data is not compressed). In one embodiment, the coreset size is always between 1 and 256. In step 708a, if the entropy is reasonably low (e.g., smaller than 5.5), the data is compressed. In step 708b (e.g., number "5a" in FIG. 7), for the entropy of the data with medium entropy (e.g., 5.5-6.5) and a small distance from random distribution (e.g., 0.001) the data is stored. In step 708c, for the entropy of data with higher distances, the data is compressed. In step 708d (e.g., number "5b" in FIG. 7), the data with higher entropy (e.g., greater than 6.5) and a small distance from random distribution (e.g., 0.001) should not be compressed, but data relatively far enough from random distribution (e.g., 0.02) should be compressed. Data in between the distance thresholds should be compressed using Huffman coding.

Figure 8A:
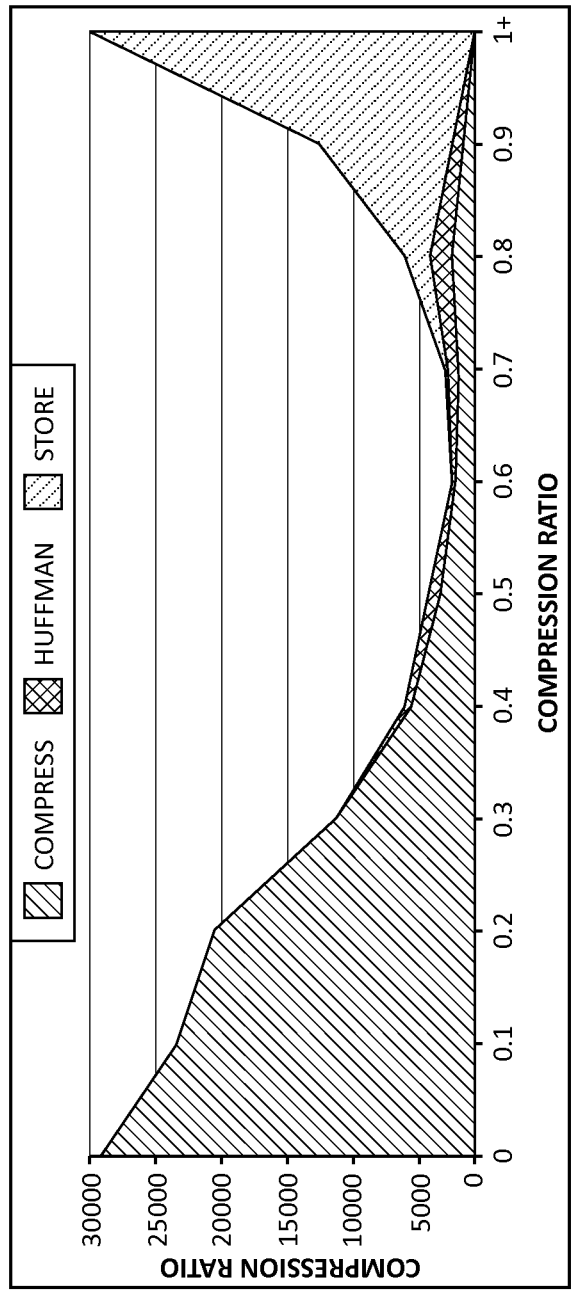
FIG. 8a is an additional exemplary graph diagram for a heuristic recommendation by compression ration for 8 KB data blocks for a file server data set in which aspects of the present invention may be realized.

FIG. 8a is an additional exemplary graph diagram for a heuristic recommendation by compression ration for 8 KB data blocks for a file server data set in which aspects of the present invention may be realized. The X-axis shows the compression ratio ranging from 0 to 1. Compression ratios higher than 1 are represented as 1, which is denoted in the X-axis as 1+. The heuristic recommendation by compression ratio indicates the data sequences are either compressed, encoded using Huffman coding, or stored, as described above. The Y-axis shows the number of samples. As can be observed, FIG. 8a illustrates a heuristic method's recommendations for the compression ratio for a file server data set. An overwhelming majority of the incompressible data with compression ratio higher than 0.9 are identified. Compressible data (with compression rate under 0.8) is identified almost always as compressible. For compression ratios between 0.8 and 0.9 the recommendations are mixed. It should be noted that the intention is to categorize such data as incompressible but data in this range turns out to be difficult to identify accurately (especially for 8 KB blocks).

Figure 8B:
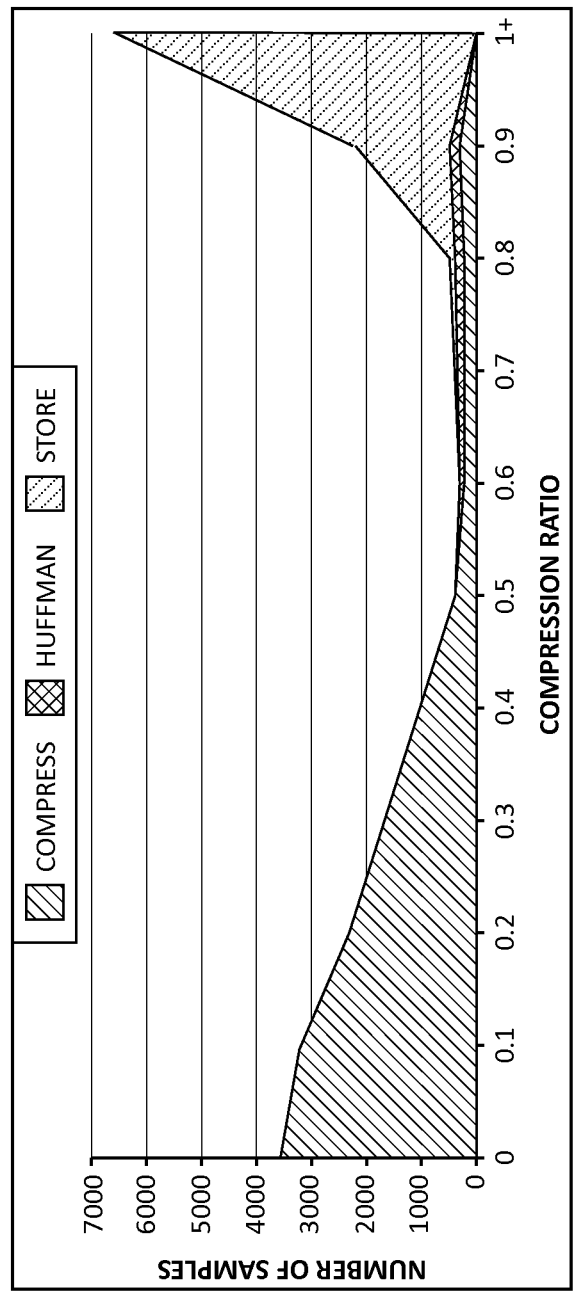
FIG. 8b is an additional exemplary graph diagram for a heuristic recommendation by compression ration for 8 KB data blocks for a VM images data set in which aspects of the present invention may be realized.

FIG. 8b is an additional exemplary graph diagram for a heuristic recommendation by compression ration for 8 KB data blocks for a virtual machine (VM) images data set in which aspects of the present invention may be realized. The X-axis shows the compression ratio ranging from 0 to 1. Compression ratios higher than 1 are represented as 1, which is denoted in the X-axis as 1+. The heuristic recommendation by compression ratio indicates the data sequences are either compressed, encoded using Huffman coding, or stored, as described above. The Y-axis shows the number of samples. As can be observed, FIG. 8b illustrates a heuristic method's recommendations for the compression ratio for a file server data set. An overwhelming majority of the incompressible data with compression ratio higher than 0.9 are identified. Compressible data (with compression rate under 0.8) is identified almost always as compressible. For compression ratios between 0.8 and 0.9 the recommendations are mixed. It should be noted that the intention is to categorize such data as incompressible but data in this range turns out to be difficult to identify accurately (especially for 8 KB blocks).

Figure 8C:
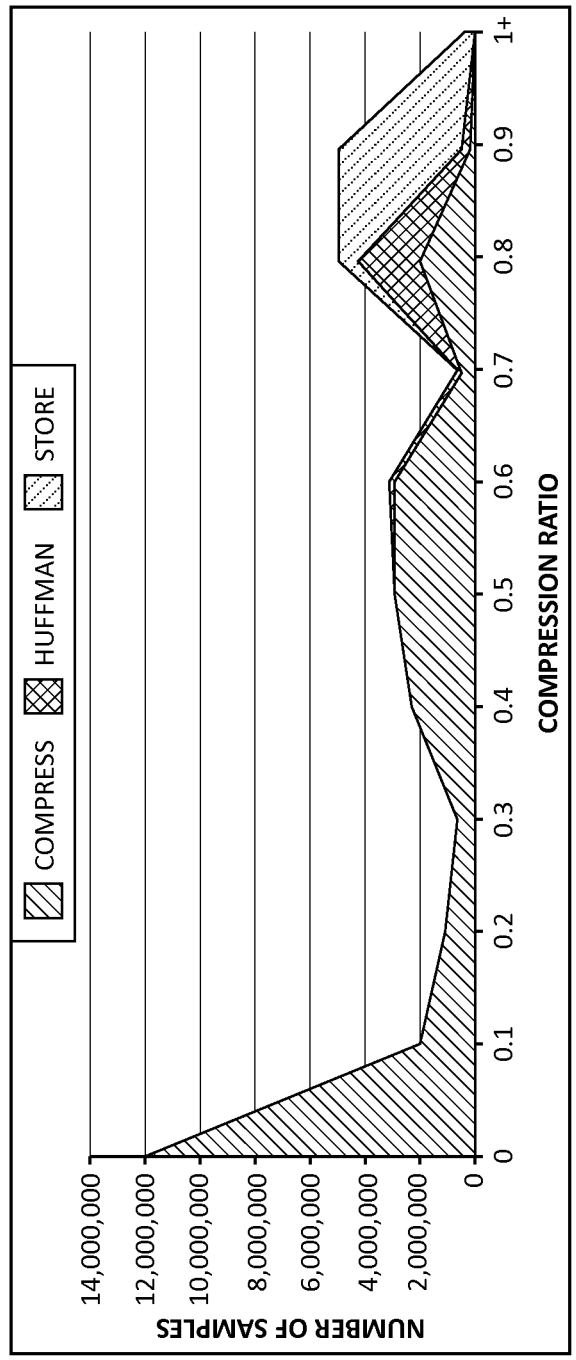
FIG. 8c is an additional exemplary graph diagram for a heuristic recommendation by compression ration for 8 KB data blocks for a benchmark data set in which aspects of the present invention may be realized.

FIG. 8c is an additional exemplary graph diagram for a heuristic recommendation by compression ration for 8 KB data blocks for a benchmark data set in which aspects of the present invention may be realized. The X-axis shows the compression ratio ranging from 0 to 1. Compression ratios higher than 1 are represented as 1, which is denoted in the X-axis as 1+. The heuristic recommendation by compression ratio indicates the data sequences are either compressed, encoded using Huffman coding, or stored, as described above. The Y-axis shows the number of samples. As can be observed, FIG. 8b illustrates a heuristic method's recommendations for the compression ratio for a file server data set. An overwhelming majority of the incompressible data with compression ratio higher than 0.9 are identified. Compressible data (with compression rate under 0.8) is identified almost always as compressible. For compression ratios between 0.8 and 0.9 the recommendations are mixed. It should be noted that the intention is to categorize such data as incompressible but data in this range turns out to be difficult to identify accurately (especially for 8 KB blocks).

Figure 9:
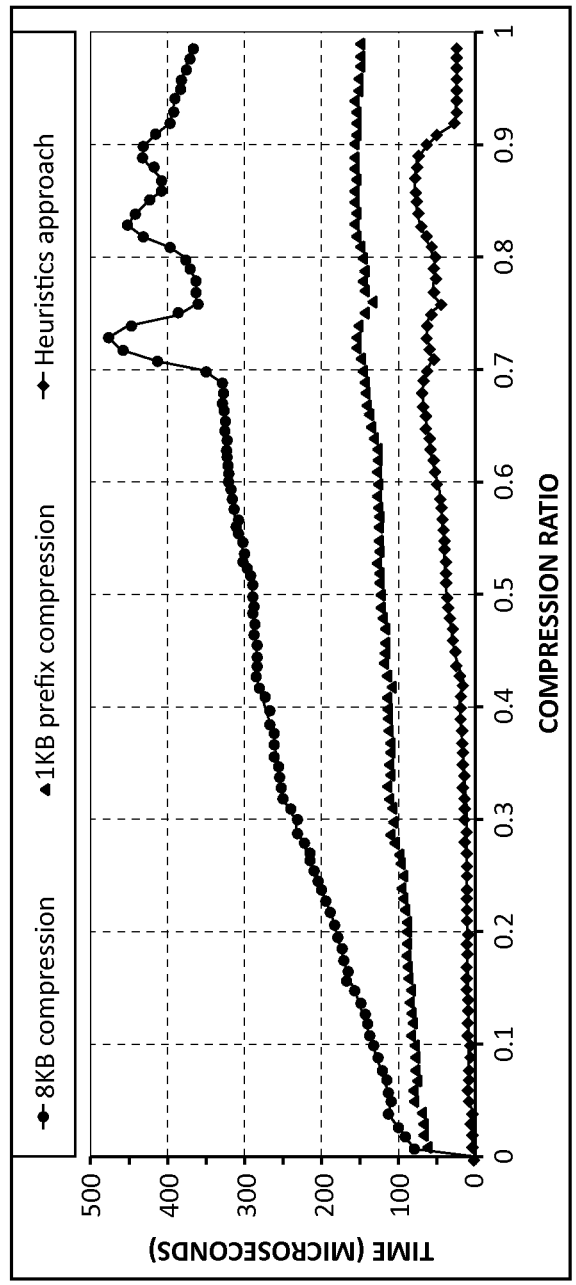
FIG. 9 is an additional exemplary graph diagram for a comparison of average compression time of compressing a 1 KB prefix, compressing 8 KB data, and the heuristic approach for data of various compression ratios in which aspects of the present invention may be realized.

FIG. 9 is an additional exemplary graph diagram for a comparison of average compression time of compressing a 1 KB prefix, compressing 8 KB data, and the heuristic approach for data of various compression ratios in which aspects of the present invention may be realized. In FIG. 9, the run time of compression, prefix compression, and the heuristics approach is illustrated. FIG. 9 illustrates the run time of the prefix estimation method on a 1 KB prefix, of the heuristic method and this is contrasted with compression time of the entire 8 KB data block. The X-axis shows the compression ratio ranging from 1 to 1. The Y-axis shows the time in microseconds. As can be observed from FIG. 9, the heuristic approach is extremely fast for both data with very good compression and for highly non-compressible data. For mid-way data, with compression ratios of 0.4 through 0.9, the present invention needs to review all (or almost all) the heuristics to reach a recommendation and thus requires a longer running time. For all compression ratios, the heuristic approach is much faster than running the prefix estimation. However, for compressible data (whenever the correct decision is made) the prefix estimation essentially comes for free, as the present invention may just continue to compress the data from the 1 KB point for incompressible data, on the other hand, the prefix compression estimation is plainly an overhead. It thus clear that for compressible data the prefix estimation method is the slightly better, but for non-compressible data the heuristic method is faster by 2 times (e.g., 2×) to 6 times (e.g., 6×).

Thus, in one embodiment, the present invention employs both the prefix estimation and the heuristics method, within a single solution. In one embodiment, the prefix method may be employed when all or most of the data is compressible, but switch to the heuristics approach whenever enough (e.g., a threshold value) non-compressible data is encountered. This mixed approach introduces only minimal overheads when handling mostly compressible data, but will provide great CPU relief once incompressible data is encountered. In one embodiment, the present invention always applying the non-compressing heuristics and provides an indication as to whether to compress the data sequences. The non-compressing heuristics may be applied on demand when a compression ratio is above a predetermined threshold for a predefined number of sequences and the applying non-compressing heuristics. The non-compressing heuristics are applied according to a size of the buffer, and the prefix compression estimation method is applied and decides whether to compress the data sequences based on the prefix compression ratio when the compression ratio of the data sequences is below a threshold.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wired, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention have been described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the above figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method for real-time reduction of CPU overhead for data compression by a processor device in a computing environment, the method comprising:
    applying non-compressing heuristics on a randomly selected data sample from data sequences for determining whether to compress the data sequences by calculating a compression potential based on the non-compressing heuristics, wherein the compression potential is compared to a threshold value; and
    performing:
        compressing the data sequences if the compress threshold is matched,
        compressing the data sequences using Huffman coding if Huffman coding threshold is matched,
        storing the data sequences without compression,
        using at least one of the non-compressing heuristics, selecting a randomly selected data sample, and
        computing core characters that compose a predefined percentage of bytes in the randomly selected data sample, an entropy of the data, a relation between appearances of character pairs and a random distribution of the character pairs, and the entropy of the character pairs for determining whether to compress the data sequences, for real-time reduction of CPU overhead for data compression.

2. The method of claim 1, further including calculating the non-compressing heuristics one after another for developing a heuristic score for making a decision for determining whether to compress the data sequences, wherein the CPU speed is optimized.

3. The method of claim 2, further including calculating the compression potential based on the heuristic score of the non-compressing heuristics.

4. The method of claim 1, further including:
    estimating a relation between appearances of character pairs and a random distribution of the character pairs by:
        comparing a number of pairs from core characters in the randomly selected data sample against the number of pairs from the core characters expected to appear in a random distribution in the randomly selected data sample, and
        calculating a $L^2$ norm distance between a first vector of distributions representing an observed distribution of the number of pairs from the core characters in the randomly selected data sample and a second vector of distributions representing an expected distribution of single values assuming there is no correlation between subsequent pairs from the core characters.

5. The method of claim 1, further including performing one of turning off and turning on the calculating the compression potential, and determining whether to compress the data sequences according to a predefined setting.

6. The method of claim 1, wherein the predefined setting, further includes at least one of:
    continuously applying the non-compressing heuristics and providing an indication as to whether to compress the data sequences,
    applying the non-compressing heuristics on demand when a compression ratio is above the predetermined threshold for a predefined number of the data sequences,
    applying the non-compressing heuristics according to a size of a buffer, and applying a prefix compression estimation and deciding whether to compress the data sequences based on a prefix compression ratio when the prefix compression ratio of the data sequences is below a threshold.

7. The method of claim 1, further including applying the non-compressing heuristics to a relation between character pairs of core characters and random distributions of the character pairs of the core characters from the randomly selected data sample from data sequences for determining whether to compress the data sequences by calculating the compression potential based on the non-compressing heuristics.

8. A system for real-time reduction of CPU overhead for data compression in a computing environment, the system comprising:
  a processor device operable in the computing storage environment, wherein the processor device:
    applies non-compressing heuristics on a randomly selected data sample from data sequences for determining whether to compress the data sequences by calculating a compression potential based on the non-compressing heuristics, wherein the compression potential is compared to a threshold value, and performs:
      compressing the data sequences if the compress threshold is matched,
      compressing the data sequences using Huffman coding if Huffman coding threshold is matched,
      storing the data sequences without compression,
      using at least one of the non-compressing heuristics,
      selecting a randomly selected data sample, and
      computing core characters that compose a predefined percentage of bytes in the randomly selected data sample, an entropy of the data, a relation between appearances of character pairs and a random distribution of the character pairs, and the entropy of the character pairs for determining whether to compress the data sequences, for real-time reduction of CPU overhead for data compression.

9. The system of claim 8, wherein the processor device calculates the non-compressing heuristics one after another for developing a heuristic score for making a decision for determining whether to compress the data sequences, wherein the CPU speed is optimized.

10. The system of claim 9, wherein the processor device calculates the compression potential based on the heuristic score of the non-compressing heuristics.

11. The system of claim 8, wherein the processor device:
  estimates a relation between appearances of character pairs and a random distribution of the character pairs by:
    comparing a number of pairs from core characters in the randomly selected data sample against the number of pairs from the core characters expected to appear in a random distribution in the randomly selected data sample, and
    calculating a $L^2$ norm distance between a first vector of distributions representing an observed distribution of the number of pairs from the core characters in the randomly selected data sample and a second vector of distributions representing an expected distribution of single values assuming there is no correlation between subsequent pairs from the core characters.

12. The system of claim 8, wherein the processor device performs one of turning off and turning on the calculating the compression potential, and determining whether to compress the data sequences according to a predefined setting.

13. The system of claim 8, wherein the processor device performs at least one of:
  continuously applying the non-compressing heuristics and providing an indication as to whether to compress the data sequences,
  applying the non-compressing heuristics on demand when a compression ratio is above the predetermined threshold for a predefined number of the data sequences,
  applying the non-compressing heuristics according to a size of a buffer, and
  applying a prefix compression estimation and deciding whether to compress the data sequences based on a prefix compression ratio when the prefix compression ratio of the data sequences is below a threshold.

14. The system of claim 8, wherein the processor device applies the non-compressing heuristics to a relation between character pairs of core characters and random distributions of the character pairs of the core characters from the randomly selected data sample from data sequences for determining whether to compress the data sequences by calculating the compression potential based on the non-compressing heuristics.

15. A computer program product for real-time reduction of CPU overhead for data compression by a processor device by a processor device, the computer program product comprising a non-transitory computer-readable storage medium having computer-readable program code portions stored therein, the computer-readable program code portions comprising:
  a first executable portion that applies non-compressing heuristics on a randomly selected data sample from data sequences for determining whether to compress the data sequences by calculating a compression potential based on the non-compressing heuristics, wherein the compression potential is compared to a threshold value, and
  a second executable portion that performs:
    compressing the data sequences if the compress threshold is matched,
    compressing the data sequences using Huffman coding if Huffman coding threshold is matched,
    storing the data sequences without compression,
    using at least one of the non-compressing heuristics,
    selecting a randomly selected data sample, and
  computing core characters that compose a predefined percentage of bytes in the randomly selected data sample, an entropy of the data, a relation between appearances of character pairs and a random distribution of the character pairs, and the entropy of the character pairs for determining whether to compress the data sequences, for real-time reduction of CPU overhead for data compression.

16. The computer program product of claim 15, further including a third executable portion that calculates the non-compressing heuristics one after another for developing a heuristic score for making a decision for determining whether to compress the data sequences, wherein the CPU speed is optimized.

17. The computer program product of claim 16, further including a fourth executable portion that calculates the compression potential based on the heuristic score of the non-compressing heuristics.

18. The computer program product of claim 15, further including a third executable portion that:
  estimates a relation between appearances of character pairs and a random distribution of the character pairs by:

comparing a number of pairs from core characters in the randomly selected data sample against the number of pairs from the core characters expected to appear in a random distribution in the randomly selected data sample, and calculating a $L^2$ norm distance between a first vector of distributions representing an observed distribution of the number of pairs from the core characters in the randomly selected data sample and a second vector of distributions representing an expected distribution of single values assuming there is no correlation between subsequent pairs from the core characters.

19. The computer program product of claim 15, further including a third executable portion that performs one of turning off and turning on the calculating the compression potential, and determining whether to compress the data sequences according to a predefined setting.

20. The computer program product of claim 15, further including a third executable portion that performs at least one of:

continuously applying the non-compressing heuristics and providing an indication as to whether to compress the data sequences, applying the non-compressing heuristics on demand when a compression ratio is above the predetermined threshold for a predefined number of the data sequences, applying the non-compressing heuristics according to a size of a buffer, and applying a prefix compression estimation and deciding whether to compress the data sequences based on a prefix compression ratio when the prefix compression ratio of the data sequences is below a threshold.

21. The computer program product of claim 15, further including a third executable portion that applies the non-compressing heuristics to a relation between character pairs of core characters and random distributions of the character pairs of the core characters from the randomly selected data sample from data sequences for determining whether to compress the data sequences by calculating the compression potential based on the non-compressing heuristics.

* * * * *